United States Patent
Kasai et al.

(10) Patent No.: US 6,197,648 B1
(45) Date of Patent: *Mar. 6, 2001

(54) MANUFACTURING METHOD OF MOSFET HAVING SALICIDE STRUCTURE

(75) Inventors: Kunihiro Kasai; Hisato Oyamatsu, both of Yokohama (JP)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/150,096

(22) Filed: Sep. 9, 1998

(30) Foreign Application Priority Data

Sep. 10, 1997 (JP) .................................... 9-245348

(51) Int. Cl.[7] .................................................. H01L 21/336
(52) U.S. Cl. ...................... 438/305; 438/299; 438/303; 438/595
(58) Field of Search ................................... 438/299, 301, 438/303, 305, 306, 307, 595

(56) References Cited

U.S. PATENT DOCUMENTS

| | | | |
|---|---|---|---|
| 5,770,508 | * | 6/1998 | Yeh et al. .............................. 438/305 |
| 5,783,475 | * | 7/1998 | Ramaswami .......................... 438/303 |
| 5,817,563 | * | 6/1998 | Lim ....................................... 438/307 |

FOREIGN PATENT DOCUMENTS 7-263682   10/1995   (JP) .

* cited by examiner

*Primary Examiner*—Charles Bowers
*Assistant Examiner*—Jack Chen
(74) *Attorney, Agent, or Firm*—Banner & Witcoff, Ltd.

(57) ABSTRACT

A gate electrode is formed in an element region of a semiconductor substrate. By ion implantation using the gate electrode as the mask, a low density doping (LDD) region is formed. By ion implantation after forming a side wall insulating film on the side wall of the gate electrode, source and drain regions are formed. Afterwards, by varying the thickness of the side wall insulating film of the side wall of the gate electrode, that is, by reducing the thickness of the side wall insulating film, a sufficient silicide region is formed on the source and drain regions. A silicide layer is formed on the gate electrode and source and drain regions by thermal reaction between a refractory metal and silicon in the gate electrode or in the semi-conductor substrate.

8 Claims, 4 Drawing Sheets

MANUFACTURING METHOD OF MOSFET HAVING SALICIDE STRUCTURE

BACKGROUND OF THE INVENTION

The present invention relates to a manufacturing method of semiconductor device, and more particularly to a MOSFET of so-called salicide structure having a silicide layer on a source region, on a drain region, and on a gate electrode.

FIG. 1 shows a plane pattern of a conventional semiconductor device.

A semiconductor substrate 11 is divided into an element isolation region 12, and an element region 13. In the element isolation region 12, a field oxide film by LOCOS method, or a silicon oxide film in STI (Shallow Trench Isolation) structure is formed. In the element region 13, a MOSFET is formed. The MOSFET is composed of a gate electrode 14, and source and drain regions 15 formed in the semiconductor substrate 11 at both sides of the gate electrode 14.

In such semiconductor device, the interval of gate electrodes 14 of two MOSFETs adjacent to each other is expressed by W. Hitherto, by minimizing this interval W, it has been attempted to reduce the area of one MOSFET occupying on the semiconductor substrate 11, and mount the MOSFETs on the semiconductor substrate 11 at high density.

FIG. 2 shows a conventional semiconductor device attempted to enhance the density of MOSFETs. FIG. 3 shows a sectional view along line III—III in FIG. 2.

It is a first feature of this semiconductor device that the contact of the source and drain regions 15 of the MOSFET is achieved at one position only at the end of the source and drain regions 15 so as to minimize the interval W of the gate electrodes 14 of two MOSFETs adjacent to each other.

In this case, it contributes to enhancement of density of MOSFETs, but the length Y of the source and drain regions 15 is extremely short, and its resistance value is large. As a result, the potential in the contact area 16 and the potential at a position remote from the contact area 16 are different, and the characteristic of the MOSFET is impaired.

Hence, it is a second feature herein that a silicide layer 17 is formed on the source and drain regions 15. The silicide layer 17 is low in the resistance value, and is effective for suppressing the potential drop between the contact area 16 and a position remote from the contact area 16. In this example, the salicide structure is employed by forming a silicide layer 17 also on the gate electrode 14 aside from the source and drain regions 15.

On the other hand, as the MOSFET becomes smaller in size, the LDD structure is often employed for alleviating the electric field near the source and drain regions at the end of the gate electrode 14. The LDD structure is composed of a low density doping region 18 having a lower concentration than the concentration of the source and drain regions 15.

Incidentally, when the length X of the gate electrode 14 is about 0.25 microns (250 nm), the length Y of the source and drain regions 15 is set at about 200 nm. To realize the LDD structure, the width a of a side wall insulating film (spacer) 19 must be least 100 nm in consideration of the extended width (about 50 nm) h of the source and drain regions 15 due to thermal diffusion.

That is, the width b of possible silicide forming region is Y-a (about 100 nm). Usually, the width Z of the source and drain regions is several microns, and if the resistance value R of the silicide layer 17 is low, as shown in FIG. 4, a potential drop occurs between the contact area 16 and a position remote from the contact area 16 due to this resistance value R, and the characteristic of the MOSFET is impaired.

To prevent such potential drop, the width a of the side wall insulating film 19 must be reduced, but if the width a of the side wall insulating film 19 is too narrow, the source and drain regions 15 may cover the low density doping region 18 by the lateral diffusion of the source and drain regions 15, thereby worsening the short channel effect of the MOSFET.

Thus, conventionally, the potential drop in the source and drain regions was prevented by forming a silicide layer on the source and drain region, but in the case of MOSFET having LDD structure, when the length of the source and drain regions becomes short, the region for forming the silicide layer is decreased by the portion of the thickness (width) of the side wall insulating film for LDD, and the potential drop cannot be prevented sufficiently.

BRIEF SUMMARY OF THE INVENTION

The invention is devised to solve the above problems, and it is hence an object thereof to present a manufacturing method of semiconductor device capable of sufficiently preventing potential drop in the source and drain regions by the silicide layer on the source and drain regions even in the MOSFET having LDD structure.

To achieve the object, the manufacturing method of semiconductor device of the invention comprises the steps of forming a gate electrode on a semiconductor substrate, forming a low density doping region by ion implantation of impurities in the semiconductor substrate by using the gate electrode as the mask, forming a first insulating film for covering the gate electrode on the semiconductor substrate, forming a second insulating film having an etching selective ratio to the first insulating film on the first insulating film, forming a side wall insulating film composed of a laminate film of the first and second insulating films only on the side wall of the gate electrode by etching the first and second insulating films by anisotropic etching, forming source and drain regions by ion implantation of impurities into the semiconductor substrate by using the gate electrode and the side wall insulating film as the mask, removing the second insulating film, and forming a silicide layer on the source and drain regions after narrowing the width of the side wall insulating film by etching the first insulating film by anisotropic etching.

The width of the side wall insulating film is equal to the thickness of the first and second insulating films at the time of ion implantation for forming the source and drain regions, and is equal to the thickness of the first insulating film at the time of forming the silicide layer on the source and drain regions.

The so-called salicide structure may be formed by forming a silicide layer on the gate electrode simultaneously when forming the silicide layer on the source and drain regions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
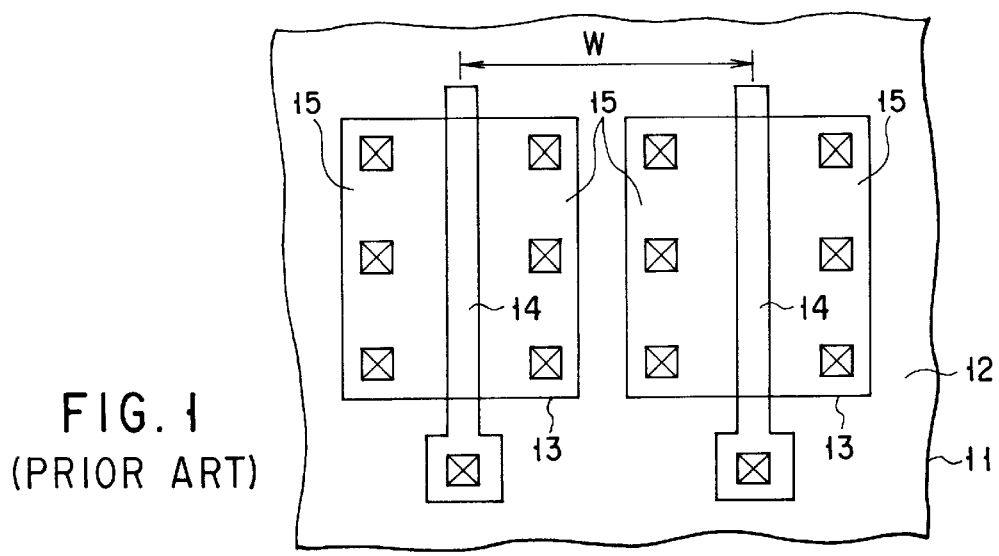
FIG. 1 is a plan view showing a conventional semiconductor device.
Figure 2:
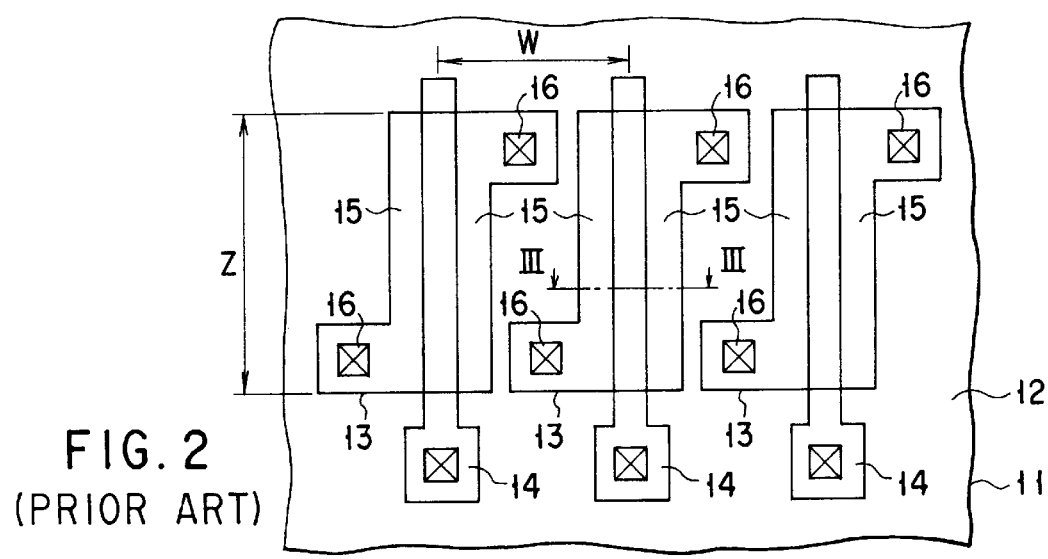
FIG. 2 is a plan view showing a conventional semiconductor device.
Figure 3:
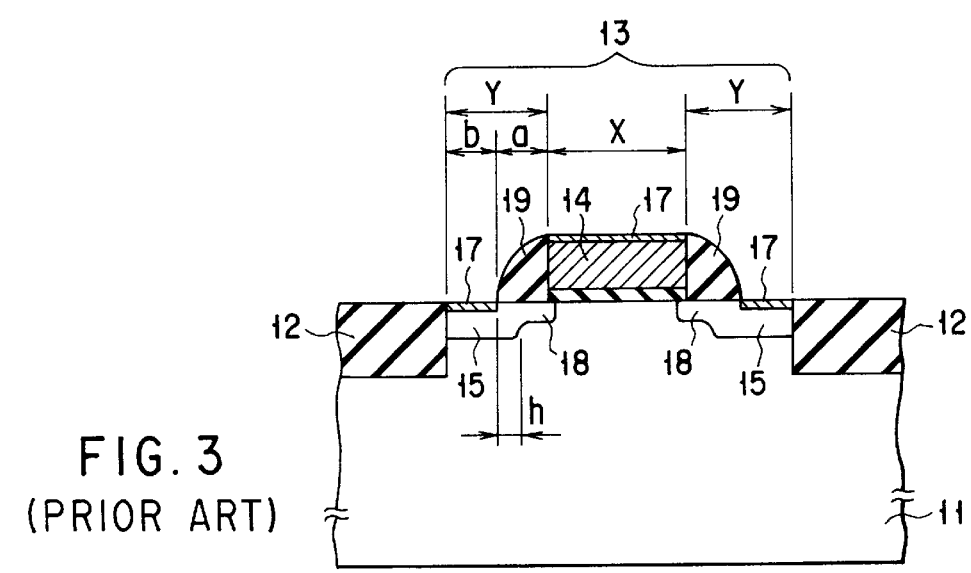
FIG. 3 is a sectional view along line III—III in FIG. 1.
Figure 4:
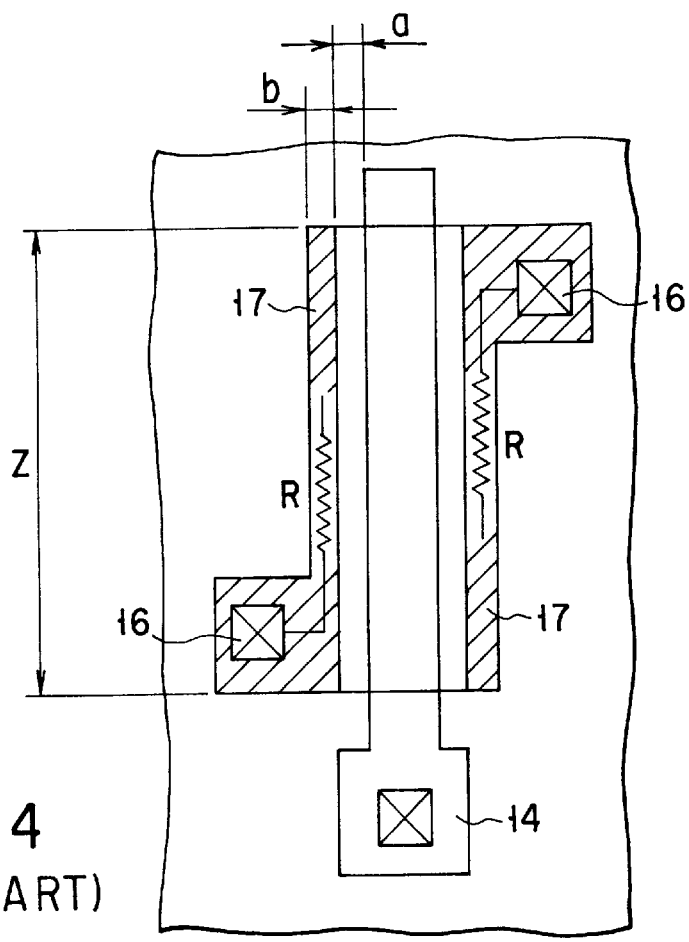
FIG. 4 is a plan view showing a conventional semiconductor device.

Referring now to the drawings, a manufacturing method of semiconductor device of the invention is described in detail below.

FIG. 5 to FIG. 11 show the manufacturing method of semiconductor device of the invention.

Figure 5:
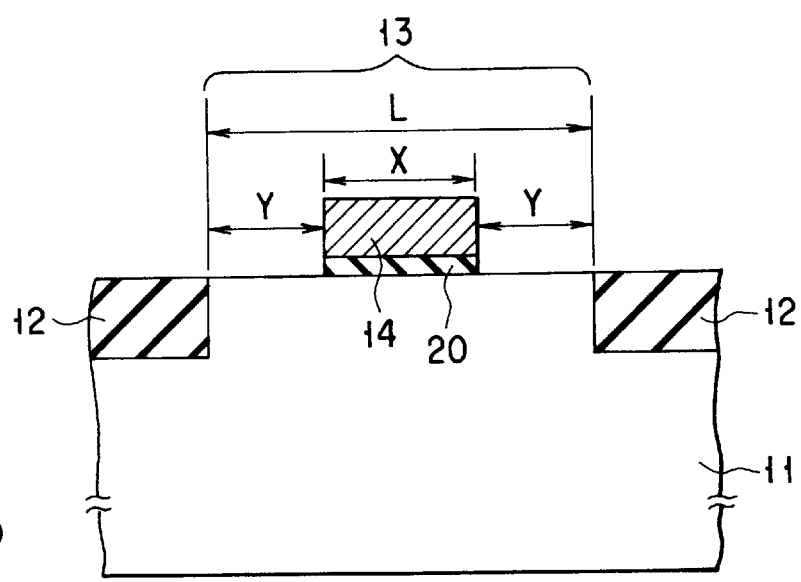
FIG. 5 is a sectional view showing a process of manufacturing method of semiconductor device of the invention.

First, as shown in FIG. 5, by photolithographic process and using RIE (reactive ion etching), grooves are formed in a semiconductor substrate (for example, P type silicon substrate) 11, and the grooves are filled with an insulating film (for example, a silicon oxide film) by CVD (chemical vapor deposition) method or CMP (chemical mechanical polishing) method, and an element isolation region 12 and an element region 13 are formed. The length L of the element region 13 is set at about 650 nm.

Then, by thermal oxidation method, for example, an oxide film is formed on the element region 13 of the semiconductor substrate 11. Next, by CVD method, for example, a polysilicon film is formed above the semiconductor substrate 11. Consequently by the photolithographic process and RIE, the polysilicon film and oxide film are processed, and a gate electrode 14 and a gate oxide film 20 are formed.

At this time, the length X of the gate electrode 14 is set, for example, at about 250 nm (design rule 0.25 micron). Hence, the width Y from the end of the gate electrode 14 to the end of element isolation region 12 is about 200 nm (=[650−250]/2).

Figure 6:
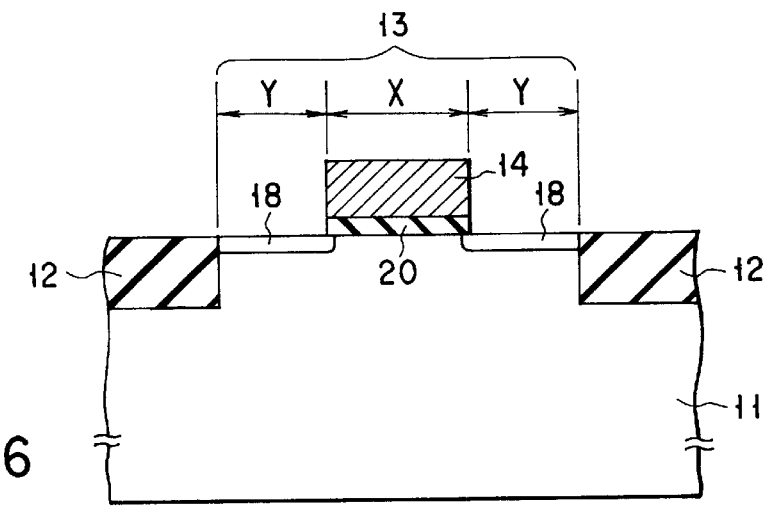
FIG. 6 is a sectional view showing a process of manufacturing method of semiconductor device of the invention.

Next, as shown in FIG. 6, using the gate electrode 14 as the mask, N type impurities, such as phosphorus (P) or arsenic (As), are injected into the semi-conductor substrate 11 by ion implantation method. As a result, the low density doping region 18 for obtaining the LDD structure is formed in the semiconductor substrate 11 in a manner like self-matching.

Figure 7:
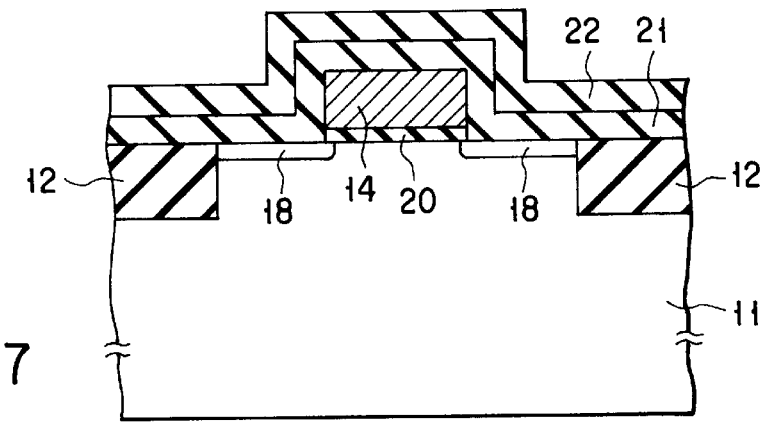
FIG. 7 is a sectional view showing a process of manufacturing method of semiconductor device of the invention.

Then, as shown in FIG. 7, by the CVD method, for example, an insulating film (for example, silicon nitride film, silicon oxide film, and the like) 21 having a thickness of about 50 nm for covering entirely the element region is formed on the semiconductor substrate 11. In succession, by the CVD method, for example, an insulating film (for example, silicon oxide film, silicon nitride, and the like) 22 having a thickness of about 50 nm with an etching selective ratio to the insulating film 21, of a different material from the insulating film 21, is formed on the insulating film 21.

Figure 8:
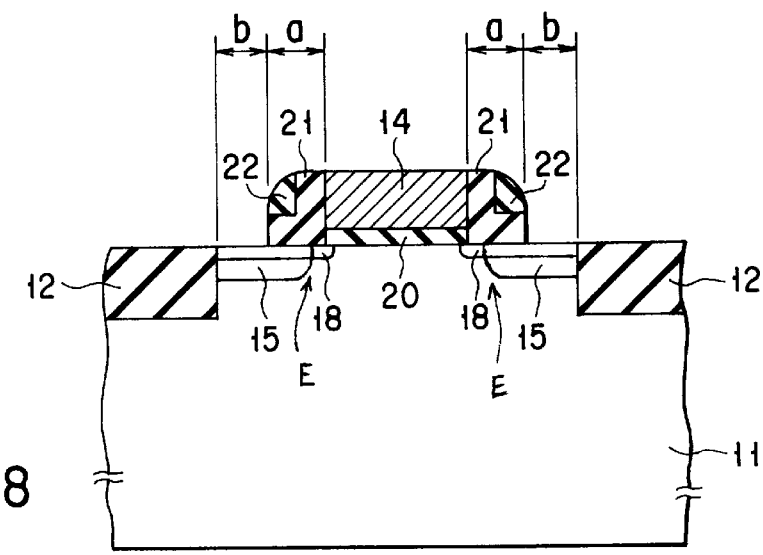
FIG. 8 is a sectional view showing a process of manufacturing method of semiconductor device of the invention.

Consequently, as shown in FIG. 8, by etching the insulating films 21, 22 by the RIE (anisotropic etching) method, the laminate film of the insulating films 21, 22 is left over only on the side wall of the gate electrode 14. More specifically, after etching the insulating film 22 in the condition having an etching selective ratio to the insulating film 21, the insulating film 21 is etched in the condition having an etching selective ratio to the insulating film 22. However, both insulating films 21, 22 may be etched in the condition of etching simultaneously.

The insulating films (side wall insulating films) 21, 22 formed on the side wall of the gate electrode 14 have a width (about 100 nm) a approximately corresponding to the total thickness of the insulating films 21, 22. At this moment, therefore, the width b from the end of the side insulating films 21, 22 to the end of the element isolation region 12 is about 100 nm.

Afterwards, using the gate electrode 14 and side wall insulating film 21, 22 as the mask, N type impurities such as phosphorus (P) or arsenic (As) are injected into the semiconductor substrate 11 by ion implantation method. As a result, source and drain regions 15 containing impurities at high concentration of about $1 \times 10^{21}$ cm$^{-3}$ are formed in the semiconductor substrate 11.

The impurities in the source and drain regions 15 are diffused by heating process (annealing process, etc.) conducted at a specific time after this process, but since the diffusion is set to about 50 nm, the source and drain regions 15 will not cover the low density doping region 18. In other words, edges E of source and drain regions 15 located under the insulating film 21 and not located under the insolating film 22.

Then, by the etching method satisfying the condition of the insulating film 22 having an etching selective ratio to the insulating film 21, only the insulating film 22 is removed. The etching method for removing the insulating film 22 may be either dry etching or wet etching as far as the above condition is satisfied, or either anisotropic etching or isotropic etching may be done.

Figure 9:
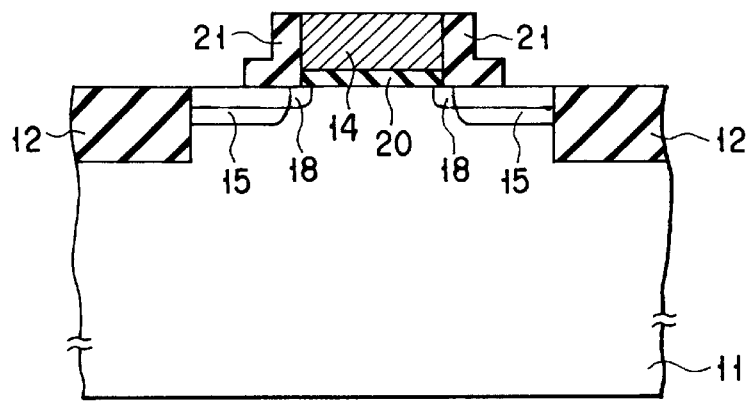
FIG. 9 is a sectional view showing a process of manufacturing method of semiconductor device of the invention.

At this moment, the insulating film 21 is in an L-shape as shown in FIG. 9.

Figure 10:
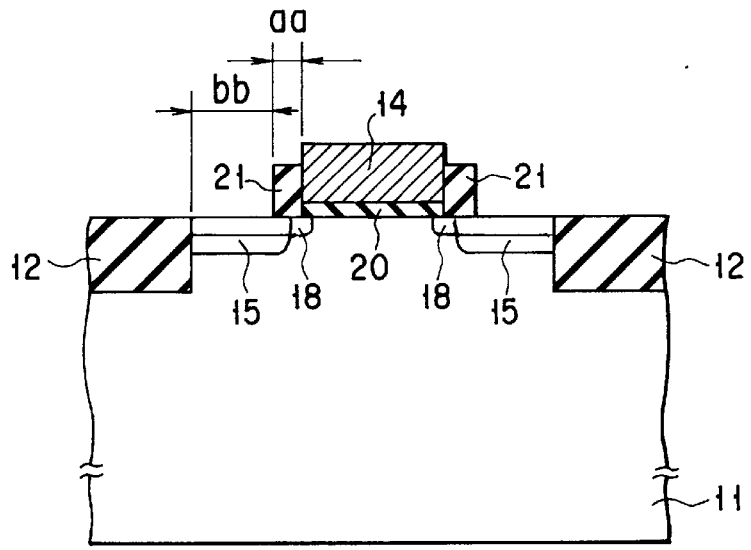
FIG. 10 is a sectional view showing a process of manufacturing method of semiconductor device of the invention.

Next, as shown in FIG. 10, by anisotropic etching such as RIE, the insulating film 21 is etched, and the L-shaped insulating film 21 is formed into an I-shape. At this point, the side wall insulating film formed on the side wall of the gate electrode 14 has a width aa (about 50 nm) corresponding to the thickness of the insulating film 21. Hence, the width bb from the end of the side wall insulating film to the end of the element isolation region 12 is about 150 nm.

Figure 11:
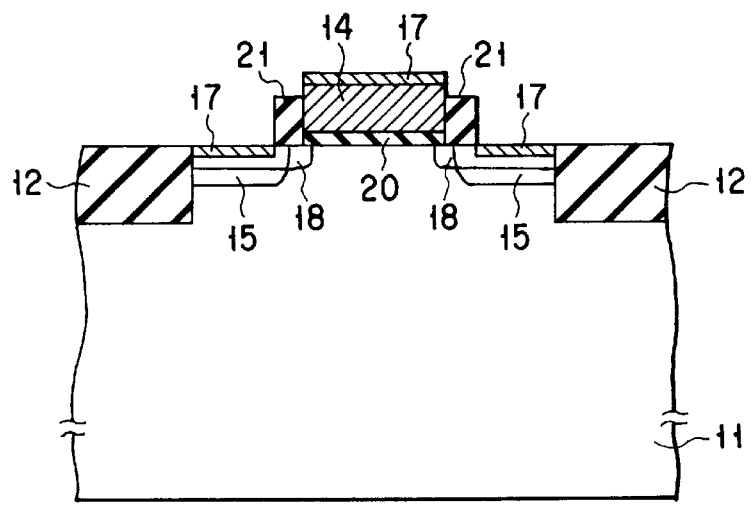
FIG. 11 is a sectional view showing a process of manufacturing method of semiconductor device of the invention.

Finally, as shown in FIG. 11, a refractory metal such as titanium (Ti) is formed on the gate electrode (polysilicon) 14 and source and drain regions (silicon) 15, and by heat treatment to react between the refractory metal and silicon, a silicide layer 17 is formed. The unreacted refractory metal is peeled off.

It is a feature of this manufacturing method, as known from FIG. 8 and FIG. 10, that the thickness of the side insulating film is changed to about 50 nm when forming the silicide after forming the source and drain regions 15 although the thickness of the side insulating film was about 100 nm when forming the source and drain regions 15.

That is, when the thickness of the side wall insulating film is about 100 nm, ion implantation is done for forming the source and drain regions 15, and in the subsequent heating process, the source and drain regions 15 have a sufficient bond depth, and will not cover completely the low density doping region 18.

Hence, without worsening the short channel effect in the MOSFET of LDD structure, bond leak when forming silicide can be prevented.

Besides, when forming the silicide layer 17 on the source and drain regions 15, the thickness of the side wall insulating film is changed to about 50 nm. Therefore, the length of the exposed portion of the source and drain regions 15 at this time is longer by the portion of the insulating film 22 as compared with the time of ion implantation when forming the source and drain regions 15.

More specifically, when the thickness of the side wall insulating film is about 100 nm, the length of the exposed portion of the source and drain regions 15 is about 100 nm, but when the thickness of the side wall insulating film is about 50 nm, the length of the exposed portion of the source and drain regions 15 is about 150 nm, and it is known, by a simple calculation, that the resistance value in the source and drain regions 15 can be decreased to ⅔.

When forming the silicide, moreover, since the side wall insulating film is present by about 50 nm, the gate electrode 14 and the source and drain regions 15 will not be short-circuited by the silicide layer 17.

The invention is effective in the MOSFET contacting with the source and drain regions 15 at one position, but can be also applied to the MOSFET of other structure. For example, it may be applied in the constitution in which contacting with the source and drain regions 15 is achieved in two or more positions, or the contact region is uniformly disposed in the source and drain regions 15.

The invention is also applicable to the CMOS structure, aside from the N channel type MOSFET and P channel type MOSFET.

As described herein, according to the manufacturing method of semiconductor device of the invention, the following effects are brought about.

In the MOSFET having an LDD structure extremely shortened in the length of the source and drain regions for reduction of area, the thickness of the side wall insulating film when forming the source and drain regions is larger than the thickness of the side wall insulating film when forming the silicide layer on the source and drain regions.

Therefore, the source and drain regions after the heating process have a sufficient bond depth and will not cover the low density doping region completely, and therefore without worsening the short channel effect in the MOSFET of LDD structure, bond leak when forming silicide can be prevented.

Moreover, when forming a silicide layer on the source and drain regions, since the thickness of the side wall insulating film is changed to a minimum limit, voltage drop from the contact area in the source and drain regions can be suppressed, and deterioration of the MOSFET characteristic can be avoided. When forming silicide, the gate electrode and source and drain regions will not be short-circuited by the silicide layer.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of semiconductor device comprising the steps of:

forming a gate electrode on a semiconductor substrate, forming low density doping regions by ion implantation of impurities in said semiconductor substrate by using said gate electrode as a mask, forming a first insulating film covering said gate electrode on said semiconductor substrate, forming a second insulating film on said first insulating film, said second insulating film having an etching selective ratio to said first insulating film;

etching said first and second insulating films by anisotropic etching, thereby forming side walls only on sides of said gate electrode, each of said side walls being a laminate film composed by said first and second insulating films;

implanting ions of impurities into said semiconductor substrate by using said gate electrode and said side walls as a mask, thereby forming source and drain regions;

removing said second insulating film of said side walls whereby portions of said source and drain regions are exposed;

etching said first insulating film by anisotropic etching after the removal of said second insulating film of said side walls, thereby narrowing a width of each of the side walls and broadening the exposed portions of said source and drain regions; and forming silicide layers on said source and drain regions after the etching step of said first insulating film.

2. A method of claim 1, wherein the width of each of said side walls is equal to a total of a thickness of said first and second insulating films at the time of ion implantation for forming said source and drain regions, and is equal to the thickness of said first insulating film at the time of forming the silicide layers on said source and drain regions.

3. A method of claim 1, wherein a silicide layer is also formed on said gate electrode, simultaneously when forming the silicide layers on said source and drain regions.

4. A method of claim 1, wherein said anisotropic etching is RIE.

5. A method of claim 1, wherein said second insulating film is removed by etching done in a condition having an etching selective ratio to said first insulating film.

6. A method of claim 1, wherein said first insulating film is a silicon nitride film, and said second insulating film is a silicon oxide film.

7. A method of claim 1, wherein said first insulating film is a silicon oxide film, and said second insulating film is a silicon nitride film.

8. A method of claim 1, wherein edges of said source and drain regions located under said first insulating film and not located under said second insulating film.

* * * * *